(12) United States Patent
Chen et al.

(10) Patent No.: US 7,796,600 B2
(45) Date of Patent: Sep. 14, 2010

(54) COMPACT MPE-FEC ERASURE LOCATION CACHE MEMORY FOR DVB-H RECEIVER

(75) Inventors: Chaoliang T. Chen, Irvine, CA (US); Tracy Denk, Aliso Viejo, CA (US); Nabil R. Yousef, Foothill Ranch, CA (US); Philip Treigherman, Newport Beach, CA (US)

(73) Assignee: Newport Media, LLC, Lake Forest, CA (US)

( * ) Notice: Subject to any disclaimer, the term of this patent is extended or adjusted under 35 U.S.C. 154(b) by 776 days.

(21) Appl. No.: 11/755,062

(22) Filed: May 30, 2007

(65) Prior Publication Data
US 2008/0298394 A1    Dec. 4, 2008

(51) Int. Cl.
*H04L 12/28* (2006.01)
*H04L 12/56* (2006.01)

(52) U.S. Cl. .................. 370/392; 370/389; 714/746; 714/752; 714/776

(58) Field of Classification Search .............. 370/389, 370/392; 714/752, 776
See application file for complete search history.

(56) References Cited

U.S. PATENT DOCUMENTS

| | | | |
|---|---|---|---|
| 7,447,980 B2 * | 11/2008 | Xu et al. | 714/776 |
| 7,451,378 B2 * | 11/2008 | Gubbi et al. | 714/752 |
| 7,610,544 B2 * | 10/2009 | Guo | 714/776 |
| 7,644,343 B2 * | 1/2010 | Gubbi et al. | 714/776 |
| 2007/0240027 A1 * | 10/2007 | Vesma et al. | 714/759 |
| 2007/0263623 A1 * | 11/2007 | Baek | 370/389 |
| 2008/0022345 A1 * | 1/2008 | Kim et al. | 725/131 |
| 2008/0178051 A1 * | 7/2008 | Huang | 714/704 |
| 2008/0282310 A1 * | 11/2008 | Koppelaar et al. | 725/118 |
| 2009/0055715 A1 * | 2/2009 | Jashek et al. | 714/776 |
| 2010/0131822 A1 * | 5/2010 | Villion | 714/758 |

* cited by examiner

*Primary Examiner*—Michael J Moore, Jr.
(74) *Attorney, Agent, or Firm*—Rahman LLC

(57) ABSTRACT

Location cache memory architectures that only require 32 Kbits or less per frame to store erasure information with simple address mapping to the main MPE-FEC RAM for easy column-wise and row-wise access. Alternative architectures are designed to greatly reduce the size and logic complexity of the MPE-FEC erasure cache memory. Two architectures reduce the erasure cache size down to 32 Kbits and 28 Kbits, correspondingly, without introducing additional erasure locations, while another architecture further reduces the required memory size down to 16K, 8K, 4K, or 2K bits with a slight increase in the total erasure locations. All architectures group the data in MPE-FEC frame memory into blocks of $2^M$ consecutive bytes and use one or a few bits to store the erasure status in each block, thereby, greatly reducing the required cache memory size.

28 Claims, 11 Drawing Sheets

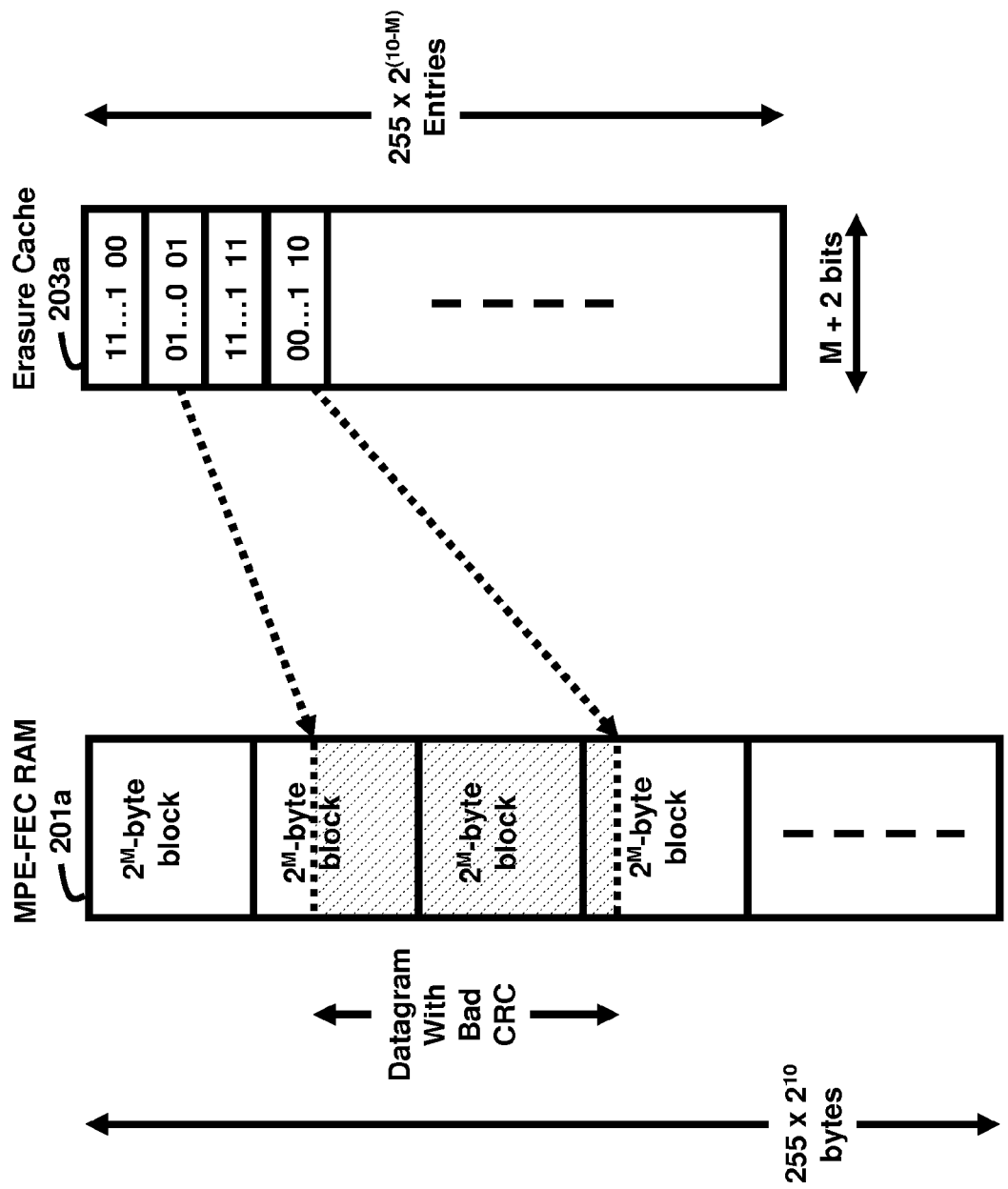

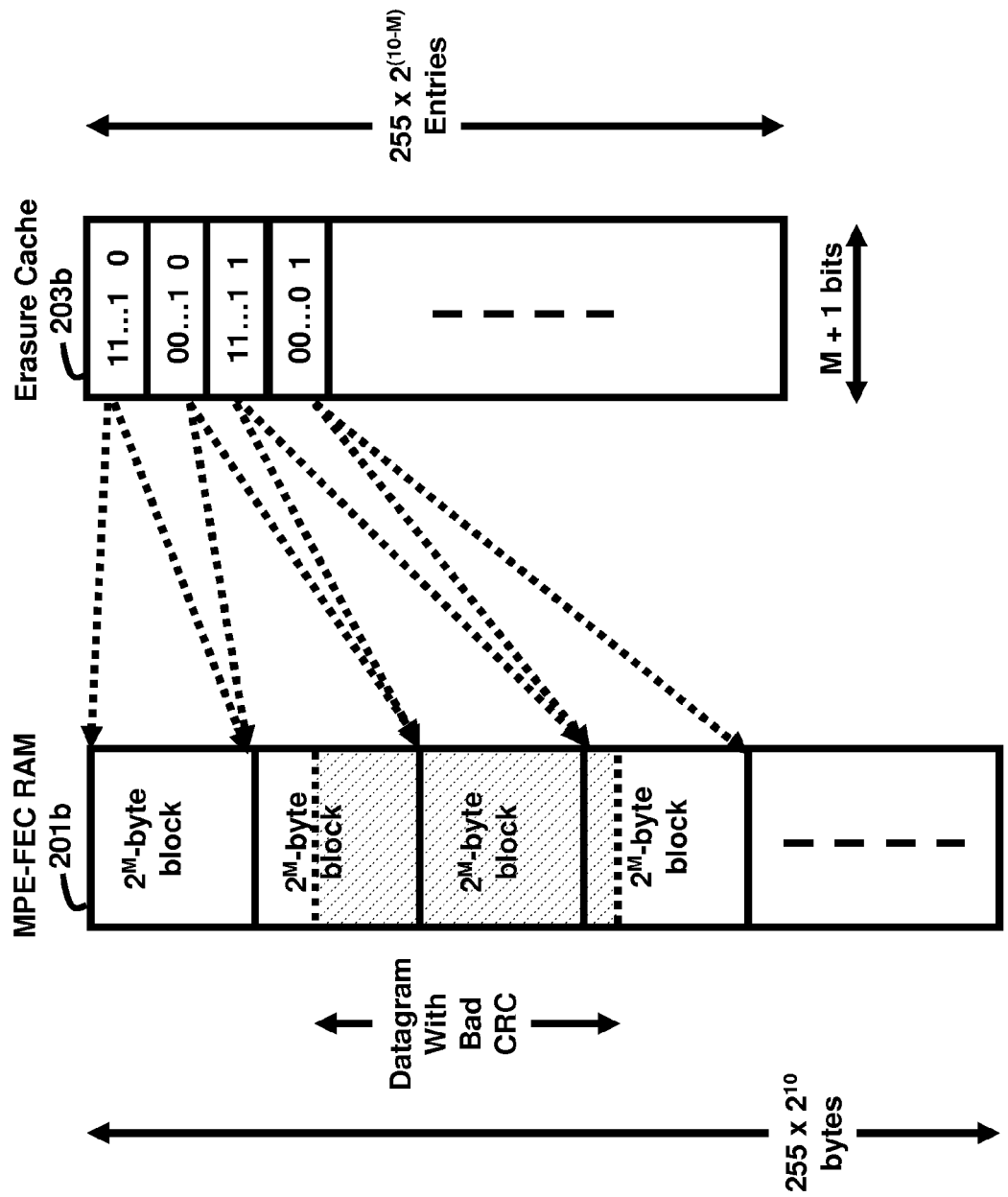

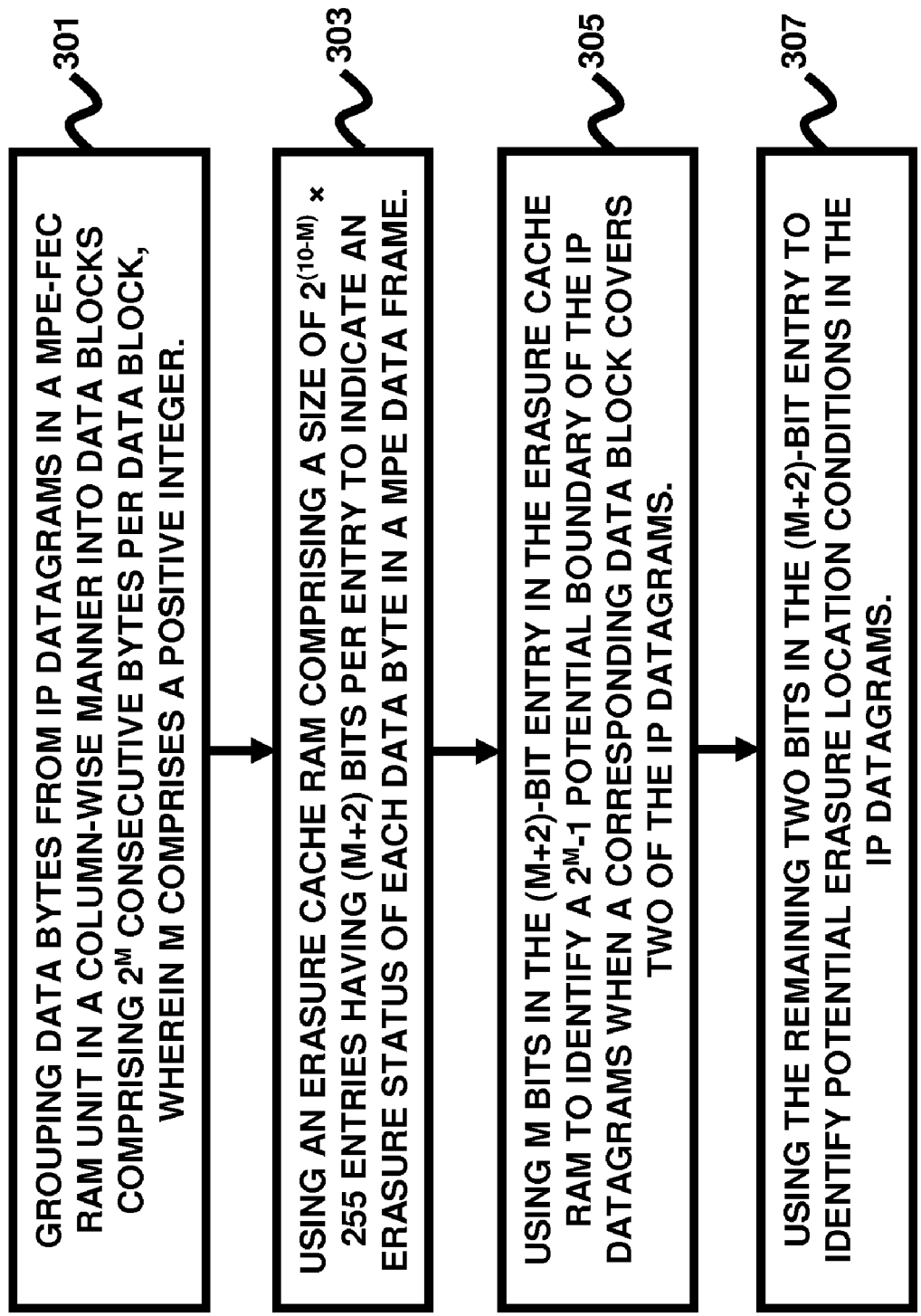

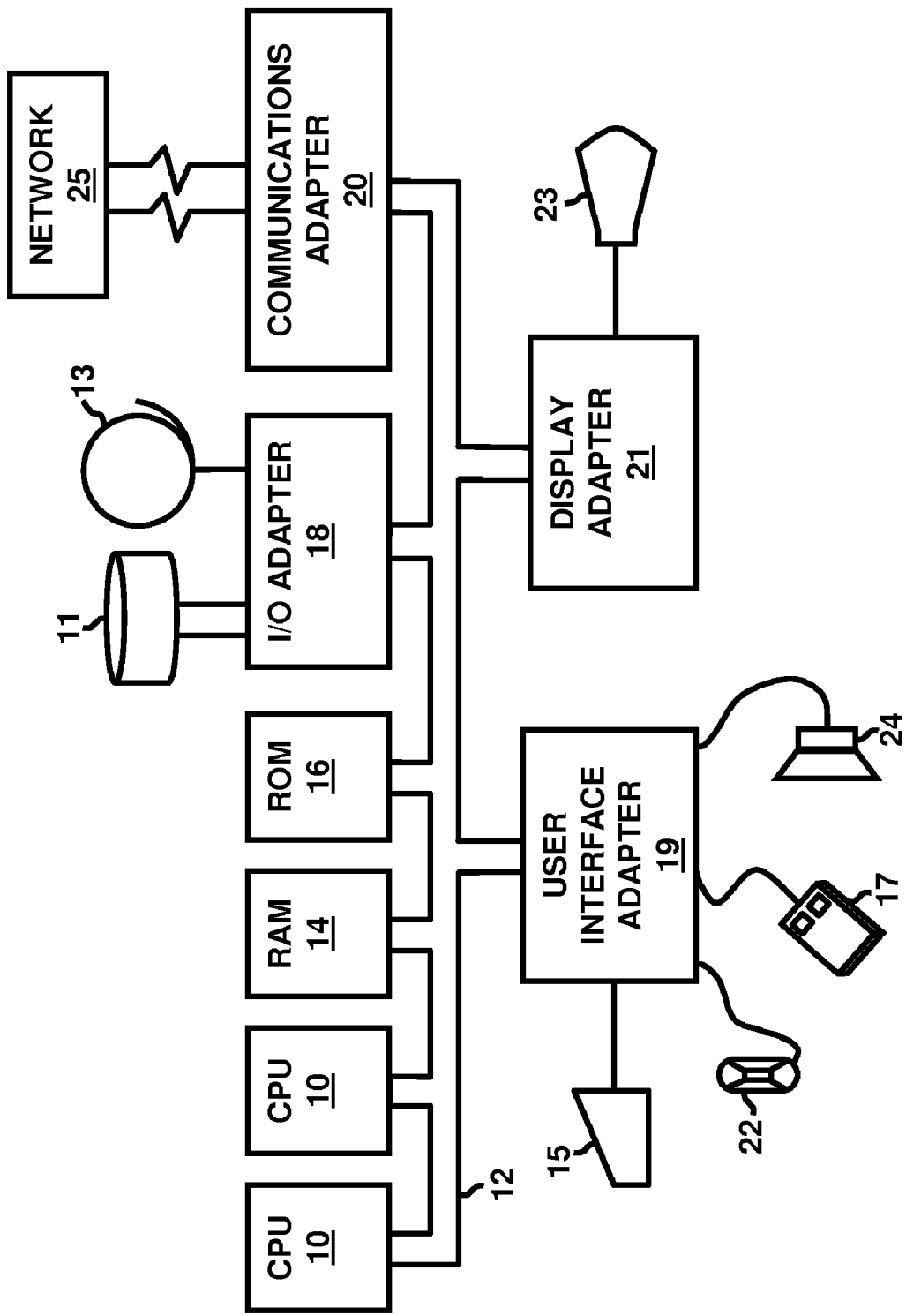

COMPACT MPE-FEC ERASURE LOCATION CACHE MEMORY FOR DVB-H RECEIVER

BACKGROUND

1. Technical Field

The embodiments herein generally relate to wireless technologies, and, more particularly, to Digital Video Broadcasting over Handheld (DVB-H) technologies.

2. Description of the Related Art

A DVB-H device transmitter employs a Multi-Protocol Encapsulator Forward Error Correction (MPE-FEC) framing scheme, which uses a Reed-Solomon (RS) encoder along with an interleaver to provide protection from burst errors caused by impairments in the communication channel. In DVB-H receivers, a RS decoder and deinterleaver are required in the MPE-FEC processing unit to recover the transmitted data. The MPE-FEC RAM in the deinterleaver stores an entire MPE data frame, which, at maximum, has a size of 1024 rows by 255 columns data bytes. The RS decoder performs error correction on these received data row-by-row. With the "erasure" information, which is derived from the received IP datagrams and marks the possible error locations, the RS decoder doubles its error correction capability over a correction mode where these "erasure" locations are not available. However, the requirement of an additional large memory to store the erasure location increases the silicon area and power consumption of the DVB-H receiver.

The MPE-FEC process in the DVB-H receiver is generally as follows:

1. Received Internet Protocol (IP) datagrams are written into the MPE-FEC RAM column-by-column by the Transport-stream packet de-multiplexer (TS demux).

2. The cyclic redundancy check (CRC) is calculated for each received IP datagram and is compared to the CRC bytes at the end of each datagram. If the CRC matches, every data byte in this IP datagram is error free. Mismatched CRC indicates at least one or more bytes in this datagram being corrupted and, as a result, every byte in this datagram is marked as "erasure" indicating possible error locations. The "erasure" location information is stored in a column-wise manner in line with the order the datagrams are received.

3. After an entire MPE frame is filled, data are read from the MPE-FEC RAM row-by-row into the RS decoder with erasure information of each byte in each row. This allows the RS decoder to correct up to 64 error bytes.

4. The RS decoder output is written back to the MPE-FEC RAM row-by-row.

5. The corrected IP datagrams are read from the RAM column-by-column for post-processing and output.

The first challenge to store the erasure location is the large size of memory required. In a straightforward implementation, one bit is required for each data byte in the MPE-FEC frame RAM to flag the erasure. That requires 255×1024=255 Kbits of memory. In an indirect indexing implementation where the starting address of each IP datagram and its CRC status is stored, one would typically need a memory to hold such information for maximum number of IP datagram per frame. In this case, the total required memory is $\lceil \log_2(255 \times 1024) \rceil + 1 = 18+1$ bits (MPE-FEC RAM address range per frame+one bit CRC status) by $(255 \times 1024)/64 = 4080$ (maximum number of IP datagram per frame since the minimum size of IP datagram is 64 bytes), which amounts to 76 Kbits per frame. In the design capable of processing multiple back-to-back DVB-H channels, one needs a MPE-FEC RAM larger than one frame and this erasure location cache memory also has to be increased proportionally.

The second challenge is to implement this erasure location cache RAM with an efficient addressing scheme for both column-wise and row-wise access since the erasure information is derived and stored in column-wise order but to be read into the RS decoder in row-wise order. An efficient scheme would allow both column-wise and row-wise accesses with simple address calculation within a single clock cycle therefore facilitating a high-throughput RS decoder, which, in turn, is essential for minimizing the MPE-FEC RAM size for a design capable of serving back-to-back DVB-H channels.

Two known methods to store the erasures for the MPE-FEC frame are direct-mapping and indirect-indexing. The direct mapping implementation is as follows: storing one erasure status bit for each data byte in the MPE-FEC frame RAM. This requires a minimum of 255×1024=255 Kbits of memory (for a single frame), and for a design capable of processing multiple frames back-to-back this number must be increased proportionally to the MPE-FEC RAM size. The indirect indexing implementation is as follows: in this case the starting address of each IP datagram and its CRC status is stored. This requires $\lceil \log_2(255 \times 1024) \rceil + 1 = 18+1$ bits of memory for one IP datagram (MPE-FEC RAM address plus one bit CRC status). Since the minimum size of an IP datagram is 64 bytes, the maximum number of IP datagrams per frame is $(255 \times 1024)/64=4080$. Thus the total memory requirement is 76 Kbits per frame (or a greater number when multiple frames are supported). The main difficulty with this approach is the fact that the erasure information is stored in MPE-FEC frame column order but processed by the RS decoder in the row order. Finding the erasure value for a particular data byte in row order is a complicated operation involving multiple erasure cache accesses and arithmetic calculations, which reduces the speed of RS decoding and greatly increases the complexity of the design. Moreover, for a design using circular MPE-FEC RAM access it would create additional complexities in erasure cache update logic, as there is no direct mapping between MPE-FEC RAM and corresponding erasure cache values. Accordingly, there remains a need for a novel erasure location cache memory technique.

SUMMARY

In view of the foregoing, an embodiment herein provides a method of identifying erasure locations in transmitted data received by a DVB-H receiver, wherein the method comprises grouping data bytes from IP datagrams in a MPE-FEC RAM unit in a column-wise manner into data blocks comprising $2^M$ consecutive bytes per data block, wherein M comprises a positive integer; using an erasure cache RAM comprising a size of $2^{(10-M)} \times 255$ entries having (M+2) bits per entry to indicate an erasure status of each data byte in a MPE data frame; using M bits in the (M+2)-bit entry in the erasure cache RAM to identify a $2^M-1$ potential boundary of the IP datagrams when a corresponding data block covers two IP datagrams; and using the remaining two bits in the (M+2)-bit entry to identify potential erasure location conditions in the IP datagrams.

The MPE-FEC RAM preferably comprises $2^{(10-M)} \times 255$ data blocks per the MPE data frame. Preferably, $2^M$ is no larger than a smallest IP datagram length such that each the data block of $2^M$ bytes comprises data from at most two of the IP datagrams. Moreover, a size of the erasure cache RAM may comprise at most 32 Kbits. Preferably, the potential erasure location conditions comprises a first condition where both of the two of the IP datagrams are error free; a second condition where only a first one of the two of the IP datagrams has errors; a third condition where only a second one of the two of the IP datagrams has errors; and a fourth condition where the both of the two IP datagrams have errors. Preferably, in the first condition, no erasures exist in the $2^M$ byte data block; in the second condition, all the data bytes before a corresponding IP datagram boundary are marked as erasures; in the third condition, all the data bytes after a corresponding IP datagram boundary are marked as erasures; and in the fourth condition, all the data bytes in a corresponding data block is marked as an erasure. Preferably, the M bits in the (M+2)-bit entry is used to indicate whether a corresponding data block covers data from exactly one IP datagram. Furthermore, the two bits in the (M+2)-bit entry may be used to indicate the first, second, third, and fourth conditions.

Another embodiment provides a method of identifying erasure locations in transmitted data received by a DVB-H receiver, wherein the method comprises grouping data bytes from IP datagrams in a MPE-FEC RAM unit in a column-wise manner into data blocks comprising $2^M$ consecutive bytes per data block, wherein M comprises a positive integer; using an erasure cache RAM comprising a size of $2^{(10-M)} \times 255$ entries having (M+1) bits per entry to indicate an erasure status of each data byte in a MPE data frame; using M bits in the (M+1)-bit entry in the erasure cache RAM to identify a $2^M-1$ potential boundary of the IP datagrams when a corresponding data block covers two of the IP datagrams with a different CRC matching status; and using the remaining one bit in the (M+1)-bit entry to identify potential erasure location conditions in the IP datagrams.

Preferably, the MPE-FEC RAM comprises $2^{(10-M)} \times 255$ data blocks per the MPE data frame. Additionally, $2^M$ is preferably no larger than a smallest IP datagram length such that each the data block of $2^M$ bytes comprises data from at most two of the IP datagrams. Moreover, a size of the erasure cache RAM may comprise at most 28 Kbits. Furthermore, the potential erasure location conditions preferably comprises a first condition where only a first one of the two of the IP datagrams has errors; and a second condition where only a second one of the two of the IP datagrams has errors. Preferably, in the first condition, all the data bytes before a corresponding IP datagram boundary are marked as erasures; and in the second condition, all the data bytes after a corresponding IP datagram boundary are marked as erasures. Moreover, the M bits in the (M+1)-bit entry is preferably used to indicate whether a corresponding data block covers data from exactly one IP datagram or covers two datagrams of the same CRC matching status. Additionally, the remaining one bit in the (M+1)-bit entry is preferably used to indicate the first and second conditions for a corresponding data block.

Another embodiment provides a method of identifying erasure locations in transmitted data received by a DVB-H receiver, wherein the method comprises grouping data bytes from IP datagrams in a MPE-FEC RAM unit in a column-wise manner into data blocks comprising $2^M$ consecutive bytes per data block, wherein M comprises a positive integer; using an erasure cache RAM comprising a size of $2^{(10-M)} \times 255$ entries having only one bit per entry to indicate an erasure status of each data byte in an entire data block; and using the only one bit to identify potential erasure location conditions in the IP datagrams.

Preferably, when a particular data block covers more than one IP datagram and there are CRC mismatches in any of the IP datagrams, then the particular data block is marked as an erasure. Moreover, when the particular data block is not marked as an erasure, then the particular data block is preferably marked as error free. Furthermore, when M equals 4, a size of the erasure cache RAM per MPE frame preferably equals 16K. Additionally, when M equals 5, a size of the erasure cache RAM per MPE frame preferably equals 8K. Also, when M equals 6, a size of the erasure cache RAM per MPE frame preferably equals 4K. The method may further comprise using the only one bit to identify two possible erasure statuses of a corresponding data block.

Another embodiment provides a lossless method of identifying erasure locations in transmitted data received by a DVB-H receiver, wherein the method comprises grouping data bytes from IP datagrams in a MPE-FEC RAM unit in a column-wise manner into data blocks comprising $2^M$ consecutive bytes per data block, wherein M comprises a positive integer; using an erasure cache RAM 107 comprising a size of $2^{(10-M)} \times 255$ entries having (M+1) bits per entry to indicate an erasure status of each data byte in a MPE data frame; and using (M+1)-bit binary encoding to represent $2^{(M+1)}$ erasure patterns, wherein the erasure patterns occur when a corresponding data block covers one or two of the IP datagrams.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 1 illustrates a schematic diagram of a first location cache memory architecture according to an embodiment herein;

FIGS. 2(A) and 2(B) illustrate schematic diagrams of a second location cache memory architecture according to an embodiment herein;

FIGS. 6(A) through 6(D) are flow diagrams illustrating preferred methods according to the embodiments herein; and FIG. 7 illustrates a schematic diagram of a computer system according to an embodiment herein.

DETAILED DESCRIPTION OF PREFERRED EMBODIMENTS

Figure 2A:
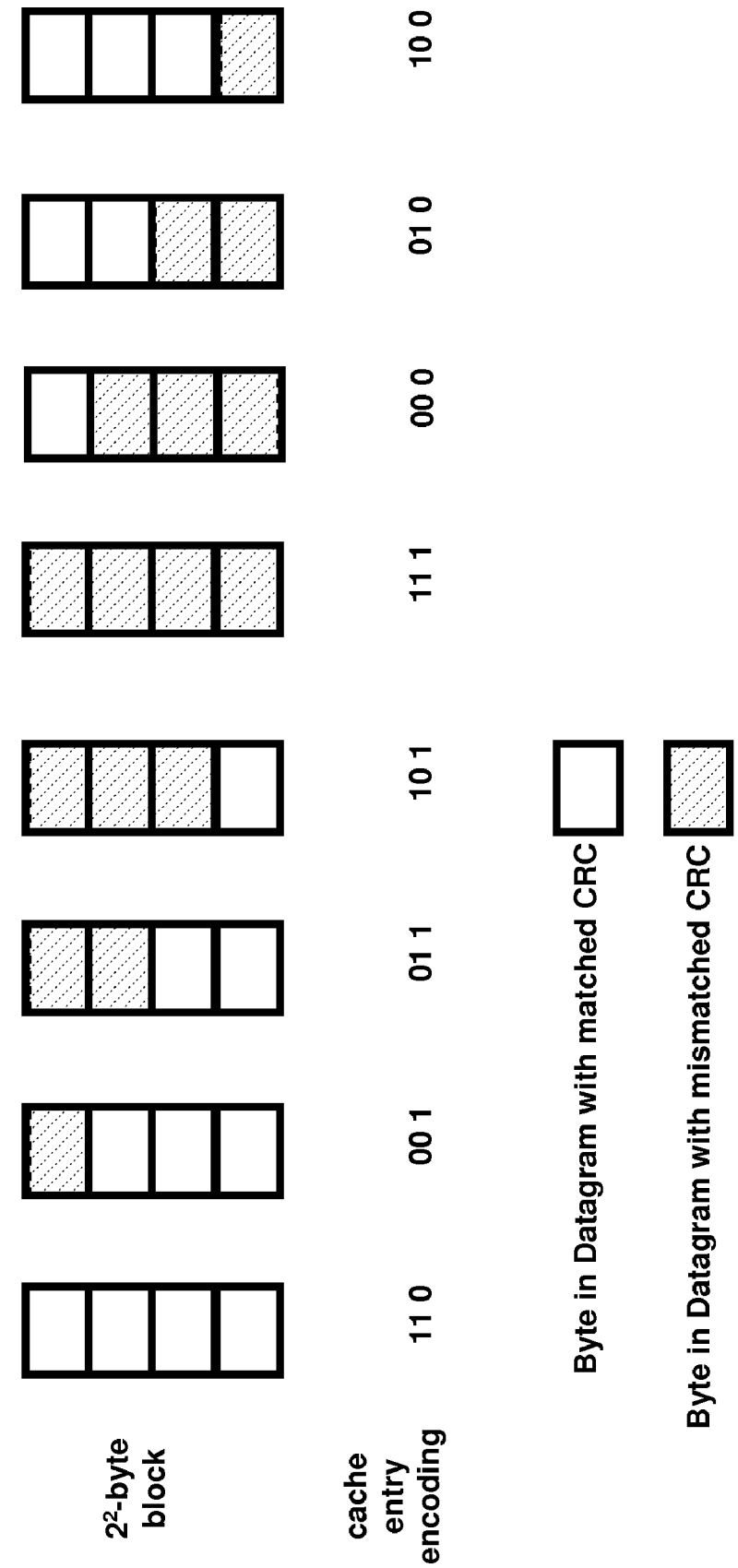

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a novel erasure location cache memory technique. The embodiments herein achieve this by providing innovative location cache memory architectures that only require 32 Kbits or less per frame to store erasure information with simple address mapping to the main MPE-FEC RAM for easy column-wise and row-wise access. Referring now to the drawings, and more particularly to FIGS. 1 through 7, where similar reference characters denote corresponding features consistently throughout the figures, there are shown preferred embodiments.

The embodiments herein provide three alternative architectures, described as "Lossless Block Mapping 1", "Lossless Block Mapping 2", and "Single-bit Block Mapping", and are designed to greatly reduce the size and logic complexity of the MPE-FEC erasure cache memory. The first two architectures reduce the erasure cache size down to 32 Kbits and 28 Kbits, correspondingly, without introducing additional erasure locations, while the later further reduces the required memory size down to 16K, 8K, 4K, or 2K bits with a slight increase in the total erasure locations. They are described as follows:

The Lossless Block Mapping 1 technique is illustrated in FIG. 1. Here, the data bytes in the MPE-FEC RAM 201a are grouped column-wise into blocks with $2^M$-byte per block. The entire MPE-FEC RAM 201a therefore has $2^{(10-M)} \times 255$ blocks per frame. An erasure cache RAM 203a of the size of $2^{(10-M)} \times 255$ entries with (M+2) bits per entry is used to indicate the erasure status of each data byte in MPE-FEC frame. M is picked such that $2^M$ is no larger than the smallest IP datagram length, therefore in each block of $2^M$ bytes, it comprises data from at most two IP datagrams. The M bits in the (M+2)-bit entry in the erasure cache is used to point to one of $2^M-1$ possible boundaries between datagrams if the corresponding block covers two datagrams, or is used to indicate the block covers data from only one datagram. Specifically, if one labels the $2^M$ bytes in the block as Byte 0 through Byte $2^M-1$, a value of k in the M bits indicates that a datagram boundary exists between Byte k and Byte k+1 in the block, for k=0, 1, 2, . . . , $2^M-2$, and the value of $2^M-1$ in the M bits indicates that there is no datagram boundary in this block. For example, M=2 implies there are $2^2$=4 bytes per block. If one denotes the 4 bytes as Byte 0, Byte 1, Byte 2, and Byte 3, the M=2 bits have the following meaning: 00 means the datagram boundary is between Byte 0 and Byte 1; 01 means the datagram boundary is between Byte 1 and Byte 2; 10 means the datagram boundary is between Byte 2 and Byte 3; 11 means the block covers data from only one datagram; i.e., there is no datagram boundary in this block. The remaining two bits in the (M+2)-bit entry indicate the following possible erasure location conditions:

00: both datagrams are error free. No erasure in this $2^M$-byte block.

10: first datagram has error(s) but not the second datagram. All bytes before the datagram boundary are erasures.

01: second datagram has error(s) but not the first datagram. All bytes after the datagram boundary are erasures.

11: both datagrams have errors. Every byte in the corresponding block is erasure.

Whenever the block covers data from only one datagram, 00 is used to indicate error free and any other combinations indicate the entire block is erasure.

Given the minimum IP datagram length of 64 bytes, M can be set as 6, 5, 4, or any number smaller, which will make the required erasure cache memory size 32K, 56K, or 96K bits. Selecting M=6 gives one the minimum cache size of 32K bits, a 58% reduction from the smallest prior conventional design.

Addressing in both column and row directions are straightforward. The one-entry to one-block mapping between the erasure cache and the MPE-FEC RAM 201a makes the address calculation simple. The erasure status of a byte in any given row can be easily deducted from the M-bit limited range pointer and the 2 status bits from the cache entry corresponding to the block contain the data byte. When writing the MPE-FEC RAM 201a, the one-entry to one-block mapping is straightforward. Since the smallest IP datagram is 64 bytes, M=6 bits are used to represent blocks of 64 bytes each, so erasure cache location i is used to describe the erasures for MPE-FEC RAM locations 64×i to 64×(i+1)−1 for i=0, 1, 2, . . . , 4079. Using this mapping, the following methodology can be used when reading location j of the MPE-FEC RAM 201a to determine if this byte represents an erasure.

Step 1: Read erasure cache entry $$\left\lfloor \frac{j}{64} \right\rfloor,$$

where $\lfloor x \rfloor$ is the floor of x, which represents the largest integer which is less than or equal to x. Step 2: Convert the first M bits of this erasure cache entry to decimal, and call this value n. Step 3: If $n=2^M-1$, there is no datagram boundary in the block. If the last two bits of the erasure cache entry are 00, location j is not an erasure. If these two bits are 01, 10, or 11, location j is an erasure. Step 4: If $n<2^M-1$, determine if location j is before or after the datagram boundary. If $$j - 64 \times \left\lfloor \frac{j}{64} \right\rfloor > n,$$

location j occurs after the datagram boundary, so the last bit of the erasure cache entry indicates if location j is an erasure (1=erasure, 0=no erasure). If $$j - 64 \times \left\lfloor \frac{j}{64} \right\rfloor \leq n,$$

location j occurs before the datagram boundary, so the second-to-last bit of the erasure cache entry indicates if location j is an erasure.

The Lossless Block Mapping 2 technique is illustrated in FIGS. 2(A) and 2(B). Here, similar to the Lossless Block Mapping 1 technique, the data bytes in the MPE-FEC RAM 201b are grouped column-wise into blocks with $2^M$-byte per block, but instead of using (M+2) bits per block in the corresponding erasure cache entry, in this further optimized architecture, (M+1) bit is used to indicate the erasure status of the entire block. This is achieved by using an alternative coding scheme for the least significant bit (LSB), where a single bit replaces the two LSB bits in each entry of the erasure cache to mark the location of the erasures within the $2^M$-byte block in the MPE-FEC RAM 201b. The most significant bit (MSB) M bits in each erasure cache entry are used the similar way as in first architecture (of FIG. 1), but this time, to mark the $2^M-1$ possible boundary of two datagrams with different CRC matching status, or the absence of such a boundary, within the $2^M$-byte data block.

The one LSB bit in an erasure cache entry is then used to indicate whether the datagram before the boundary has CRC matched. The status of the datagram after boundary is automatically the opposite of the one before the boundary in our coding. FIG. 2(A) illustrates an example of erasure cache entry coding with a data block size of $2^2$-byte and FIG. 2(B) illustrates how this is used with a MPE-FEC RAM 201b to provide the erasure information to the erasure cache 203b.

Addressing in both column and row directions are exactly the same as the first architecture. They have the straightforward and simple address mapping as described in the Lossless Block Mapping 1 method.

Given the minimum IP datagram length of 64 bytes, M can be set as 6, 5, 4, or any number smaller, which will make the required erasure cache memory size 28K, 48K, or 80K bits. Selecting M=6 gives one the minimum cache size of 28K bits, a 63% reduction from the smallest prior conventional design.

Figure 3:
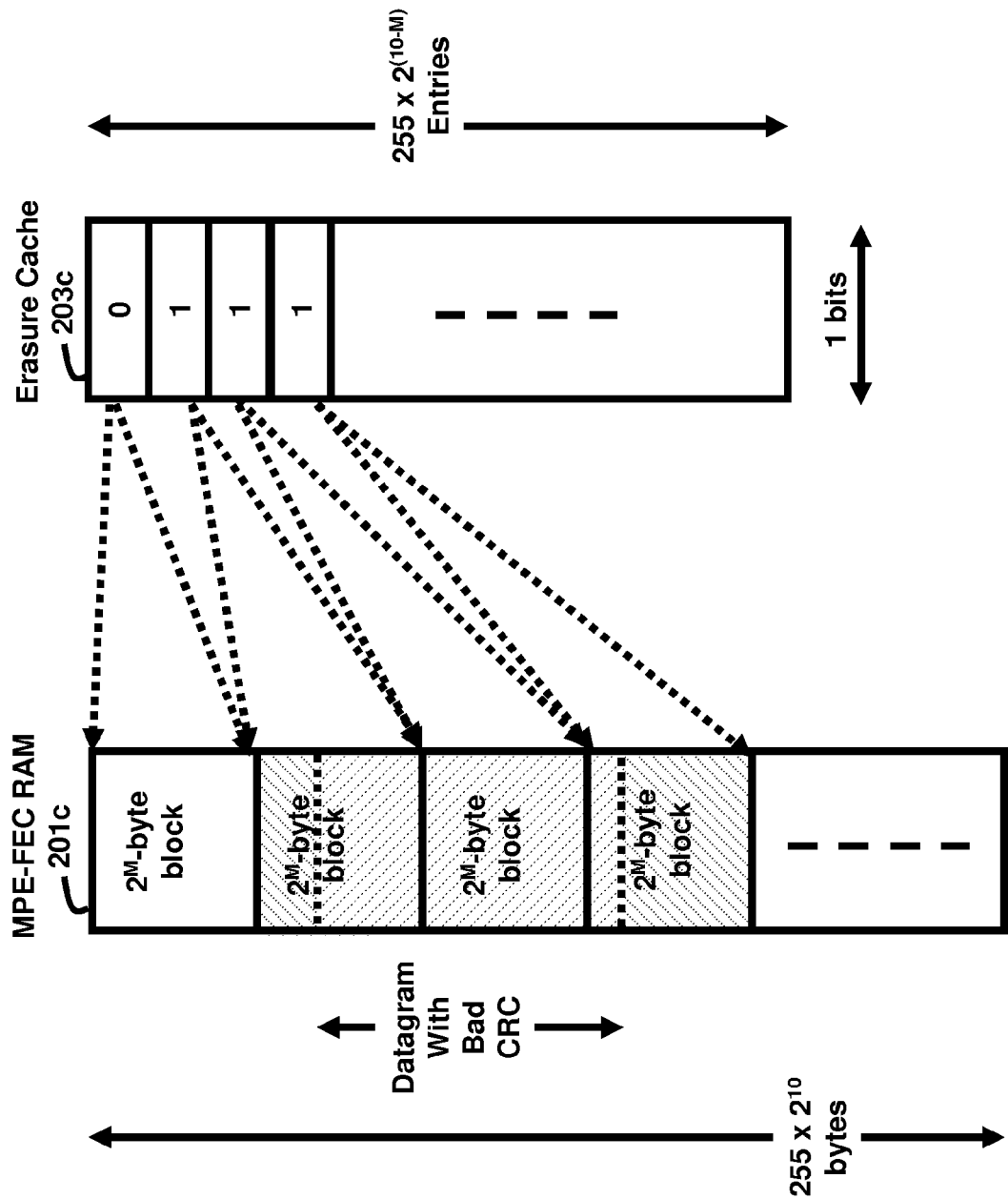
FIG. 3 illustrates a schematic diagram of a third location cache memory architecture according to an embodiment herein.

The Single-bit Block Mapping technique is shown in FIG. 3. Here, similar to the Lossless Block Mapping 1 and 2 techniques (of FIGS. 1 through 2(B)), the data bytes in MPE-FEC RAM 201c are grouped column-wise into blocks with $2^M$-byte per block, but instead of using (M+2) or (M+1) bits per block in the corresponding erasure cache entry, in this further optimized architecture, a single bit is used to indicate the erasure status of the entire block. Each block covers one or more datagrams. If there is a CRC mismatch in any of the datagrams in a block, the entire block is marked as erasure; otherwise the block is marked as error free.

The addressing to the erasure cache 203c is, again, straightforward due to the bit to block mapping. For obtaining the erasure information row-wise, it is even more simplified from the Lossless Block Mapping 1 and 2 methods since there is no need to inspect the datagram boundary pointer.

Employing one bit to mark the erasure status of the $2^M$-byte block, the required erasure cache memory size per MPE frame is reduced to 16K, 8K, or 4K for M=4, 5, 6 correspondingly. Selecting an M value larger than 6 is permissible, and further reduces the cache size with increased performance impact as further discussed below. On the other hand, selecting an M value less than 4 is also permissible, reducing the probability of performance impact with increased cache size.

The potential penalty to pay for this memory size reduction is the increased number of erasure locations. If a $2^M$-byte block covers data from multiple datagrams with both error-free and corrupted datagrams, the data byte(s) of the error-free datagram(s) in this block will be unnecessarily marked as erasure(s). This could affect the error correction capability of the RS decoder for certain combinations of numbers of CRC marked erasures (erasures resulting from a true CRC mismatch) and unnecessarily marked erasures in a row. Specifically, only when the number of CRC marked erasures in a row is 64 or fewer, the combined number of existing true erasures and unnecessarily marked erasures in this row exceeds 64 (the RS parity byte number) and the number of the actual errors in this row is between 33 and 64 will this affect the RS decoder capability, making a correctable RS row uncorrectable. On the other hand, these unnecessarily marked erasures could have no impact at all for RS decoder if the above-mentioned combination is not met.

Furthermore, the longer the datagrams and the smaller the block size, the fewer the error-free bytes will be unnecessarily marked as erasures, since there will be less blocks covering multiple datagrams for the longer datagram and less bytes being unnecessarily marked as erasure(s) in a multi-datagram block for a smaller block size. The best trade-off between erasure cache size and its performance impact can be found empirically. Extensive simulations show that there is no noticeable bit error rate degradation even when a block size of $2^5$=32 bytes is used. Therefore, practically an erasure cache memory of the size of 8K bits can be used in a design; a 32 fold reduction from the prior conventional Direct Mapping implementation.

The procedures to fill the erasure cache memory 203c is outlined as follows:

1. Erasure cache and MPE-FEC RAM write pointers are both initialized to 0.
2. The next IP datagram is written to the MPE-FEC RAM 201c, the datagram end address is saved, CRC of the datagram is calculated (1=bad, 0=good).
3. Calculate the new erasure cache write pointer as the datagram end address divided by $2^M$ (right shift by M).
4. (a) if the datagram end address is on the $2^M$-byte boundary, fill erasure cache with the CRC value starting at the old pointer and ending at the new pointer, then increment the new pointer by 1; else (b) if CRC=1, fill erasure cache with 1's starting at the old pointer and ending at the new pointer; then increment the new pointer by 1; else (c) fill erasure cache with 0's starting at the old pointer and ending at the new pointer minus 1.
5. Repeat steps 2-4 until the last datagram.

Figure 4:
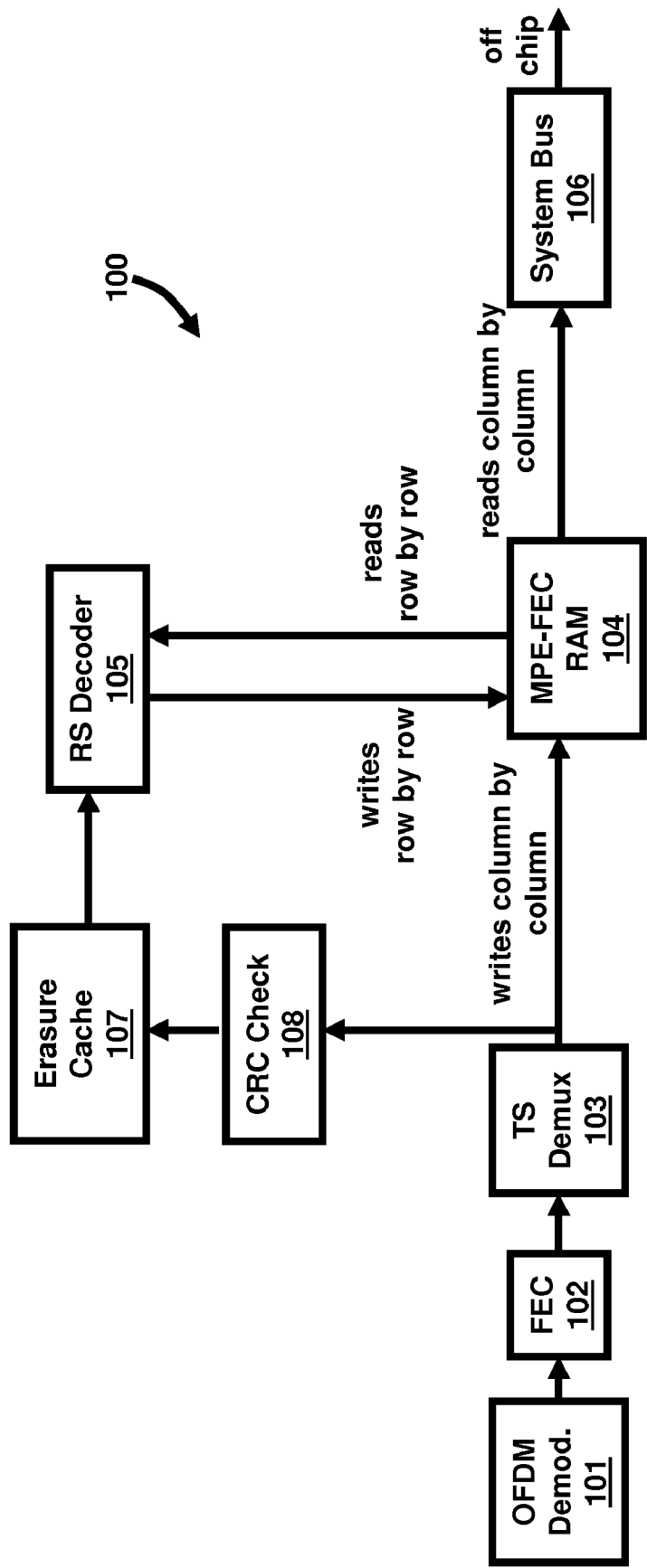
FIG. 4 illustrates a schematic diagram of a DVB-H receiver according to an embodiment herein.
Figure 5:
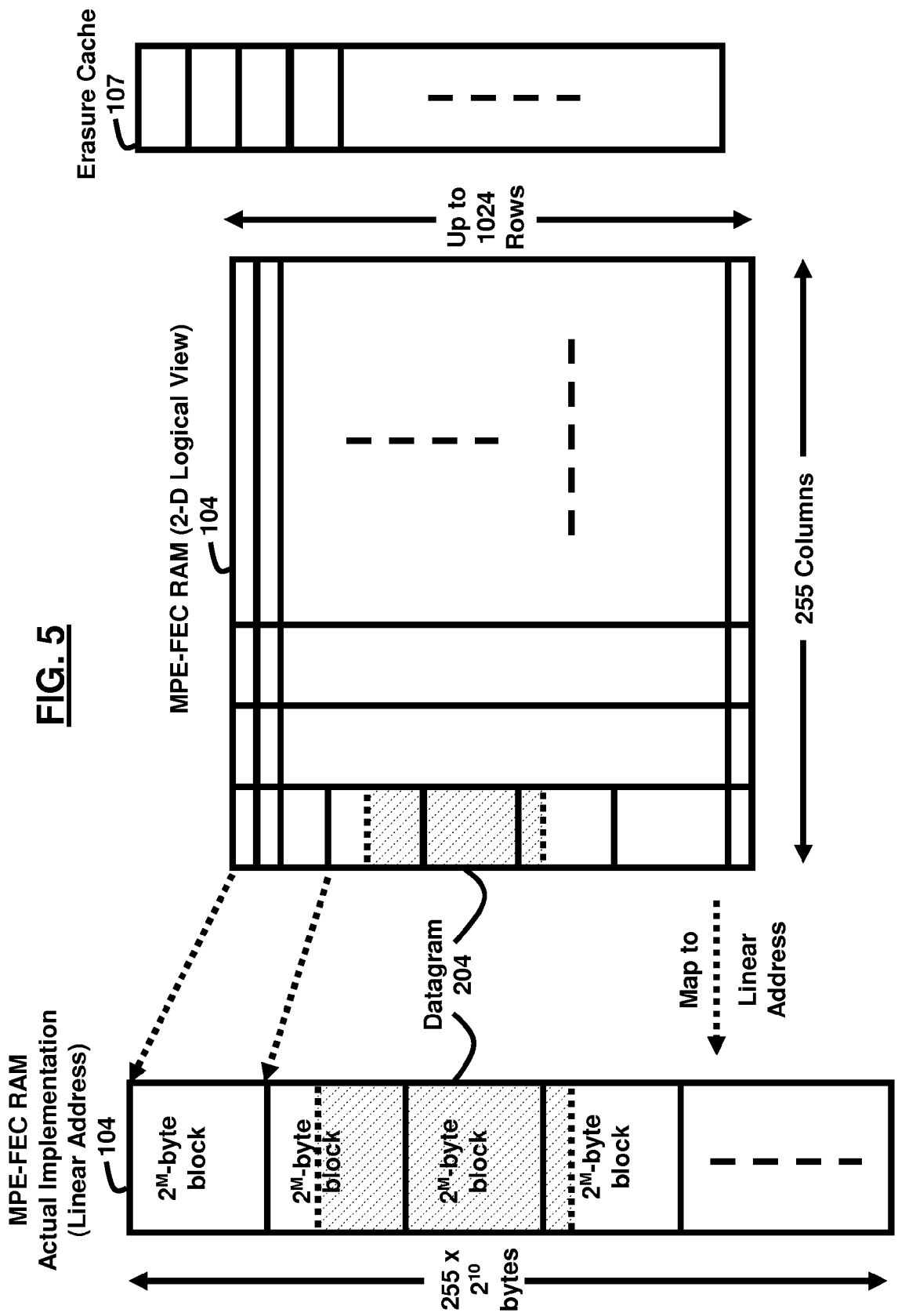
FIG. 5 illustrates a schematic diagram of an erasure cache technique according to an embodiment herein.

Generally, the embodiments herein provide three innovative architectures to significantly reduce the area, the power, and logic complexity of the erasure cache design for a RS decoder 105 in a DVB-H receiver 100. As shown in FIGS. 4 and 5, after an IP datagram is demodulated by an Orthogonal Frequency Division Multiplexing (OFDM) demodulator 101 and proceeds through a FEC process 102, the output of the TS demux 103 is written to the MPE-FEC RAM 104 and then after the IP datagram is read it proceeds to the system bus 106. These same data also go to the CRC check 108, which is used to determine the entries of the erasure cache 107. When the RS decoder 105 reads the MPE-FEC RAM 104 row-by-row, the erasure cache 107 is also read to determine whether the MPE-FEC bytes are erasures. All architectures group the data in MPE-FEC frame memory into blocks of $2^M$ consecutive bytes and use one or a few bits to store the erasure status in each block, thereby, greatly reducing the required cache memory size.

The first two architectures, the Lossless Block Mapping method 1 and 2, are able to reduce erasure cache memory size to 32K or 28K bits, respectively, without any impact on DVB-H FEC performance. The third architecture, the Single-bit Block Mapping, is able to reduce erasure cache memory size to 8K bits without noticeable DVB-H FEC performance degradation. Moreover, further size reduction is possible. The resulting erasure memory sizes are many folds improvement over the prior conventional designs. Due to the direct and simple bit(s)-to-block one-to-one mapping, the complexity of deriving the erasure cache address from MPE-FEC RAM 104 address is very low. The procedure to fill the erasure cache is very straightforward and easy to implement. Also, the procedure to read the erasure cache values into the RS decoder 105 in row order is very simple because the current erasure cache read address is virtually the same as the corresponding MPE-FEC RAM address. Additionally, both architectures provided by the embodiments herein are suitable to pair with a circular-addressed MPE-FEC RAM 104, which enables servicing multiple DVB-H channels with integrated on-chip memory, and greatly reduces the power and area of the DVB-H receiver 100.

Figure 6B:
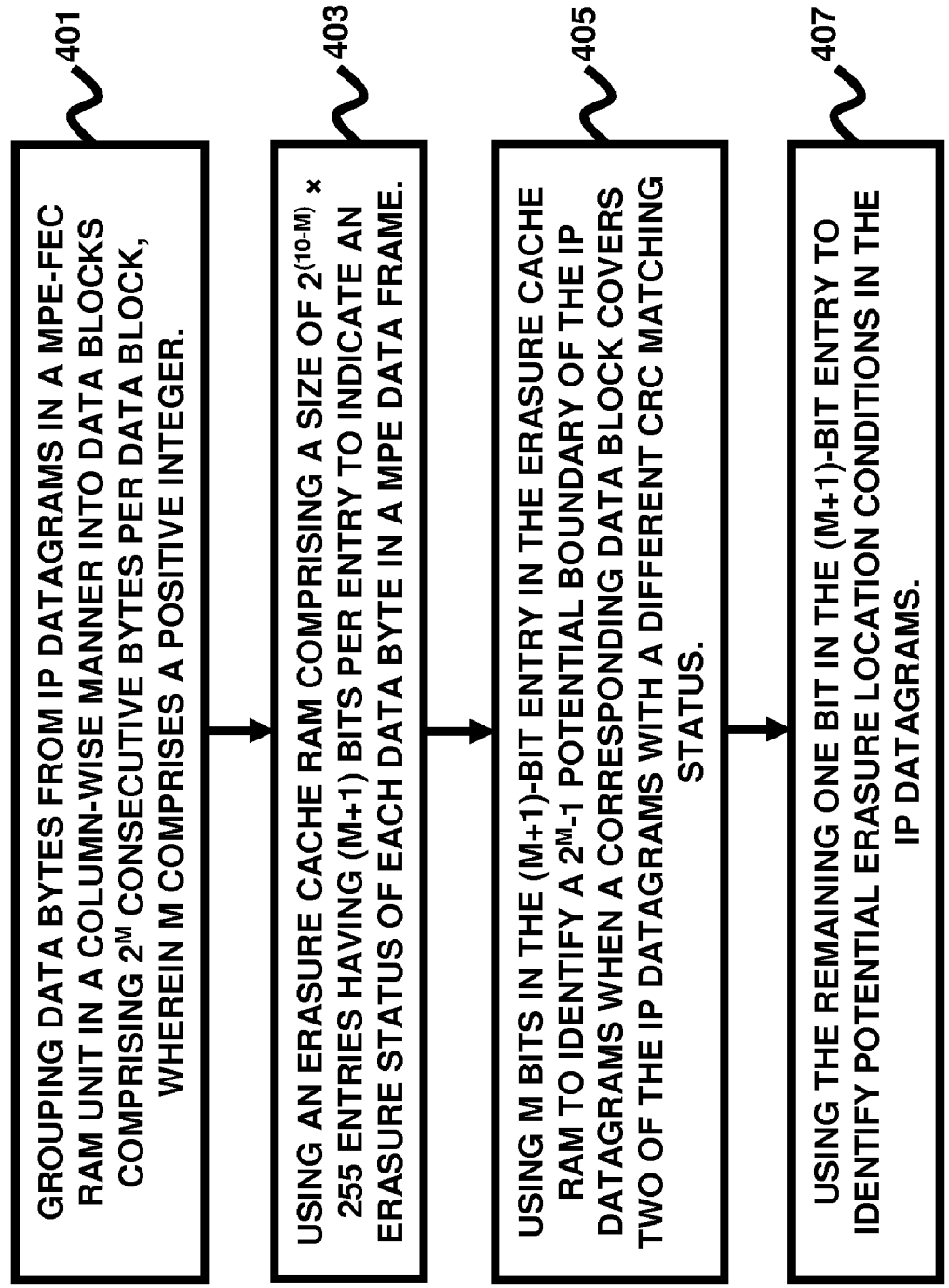

FIGS. 6(A) through 6(D), with reference to FIGS. 1 through 5, illustrate flow diagrams according to preferred embodiments herein. More particularly, FIG. 6(A) is a flow diagram illustrating the Lossless Block Mapping 1 technique of FIG. 1, wherein FIG. 6(A) illustrates a method of identifying erasure locations in transmitted data received by a DVB-H receiver 100 (of FIG. 4), wherein the method comprises grouping (301) data bytes from IP datagrams in a MPE-FEC RAM unit 201a in a column-wise manner into data blocks comprising $2^M$ consecutive bytes per data block, wherein M comprises a positive integer; using (303) an erasure cache RAM 203a comprising a size of $2^{(10-M)} \times 255$ entries having (M+2) bits per entry to indicate an erasure status of each data byte in a MPE data frame; using (305) M bits in the (M+2)-bit entry in the erasure cache RAM 203a to identify a $2^M-1$ potential boundary of the IP datagrams when a corresponding data block covers two of the IP datagrams; and using (307) the remaining two bits in the (M+2)-bit entry to identify potential erasure location conditions in the IP datagrams.

The MPE-FEC RAM 201a preferably comprises $2^{(10-M)} \times 255$ data blocks per the MPE data frame. Preferably, $2^M$ is no larger than a smallest IP datagram length such that each data block of $2^M$ bytes comprises data from at most two of the IP datagrams. Moreover, a size of the erasure cache RAM 203a may comprise at most 32 Kbits. Preferably, the potential erasure location conditions comprises a first condition where both of the two of the IP datagrams are error free; a second condition where only a first one of the two of the IP datagrams has errors; a third condition where only a second one of the two of the IP datagrams has errors; and a fourth condition where the both of the two IP datagrams have errors. Preferably, in the first condition, no erasures exist in the $2^M$ byte data block; in the second condition, all the data bytes before a corresponding IP datagram boundary are marked as erasures; in the third condition, all the data bytes after a corresponding IP datagram boundary are marked as erasures; and in the fourth condition, all the data bytes in a corresponding data block is marked as an erasure. Preferably, the M bits in the (M+2)-bit entry is used to indicate whether a corresponding data block covers data from exactly one IP datagram. Furthermore, the two bits in the (M+2)-bit entry may be used to indicate the first, second, third, and fourth conditions.

FIG. 6(B) is a flow diagram illustrating the Lossless Block Mapping 2 technique of FIGS. 2(A) and 2(B), wherein FIG. 6(B) illustrates a method of identifying erasure locations in transmitted data received by a DVB-H receiver 100 (of FIG. 4), wherein the method comprises grouping (401) data bytes from IP datagrams in a MPE-FEC RAM unit 201b in a column-wise manner into data blocks comprising $2^M$ consecutive bytes per data block, wherein M comprises a positive integer; using (403) an erasure cache RAM 203b comprising a size of $2^{(10-M)} \times 255$ entries having (M+1) bits per entry to indicate an erasure status of each data byte in a MPE data frame; using (405) M bits in the (M+1)-bit entry in the erasure cache RAM 203b to identify a $2^M-1$ potential boundary of the IP datagrams when a corresponding data block covers two of the IP datagrams with a different CRC matching status; and using (407) the remaining one bit in the (M+1)-bit entry to identify potential erasure location conditions in the IP datagrams.

Preferably, the MPE-FEC RAM 201b comprises $2^{(10-M)} \times 255$ data blocks per the MPE data frame. Additionally, $2^M$ is preferably no larger than a smallest IP datagram length such that each the data block of $2^M$ bytes comprises data from at most two of the IP datagrams. Moreover, a size of the erasure cache RAM 203b may comprise at most 28 Kbits. Furthermore, the potential erasure location conditions preferably comprises a first condition where only a first one of the two of the IP datagrams has errors; and a second condition where only a second one of the two of the IP datagrams has errors.

Preferably, in the first condition, all the data bytes before a corresponding IP datagram boundary are marked as erasures; and in the second condition, all the data bytes after a corresponding IP datagram boundary are marked as erasures. Moreover, the M bits in the (M+1)-bit entry is preferably used to indicate whether a corresponding data block covers data from exactly one IP datagram or covers two datagrams of the same CRC matching status. Additionally, the remaining one bit in the (M+1)-bit entry is preferably used to indicate the first and second conditions for a corresponding data block.

Figure 6C:
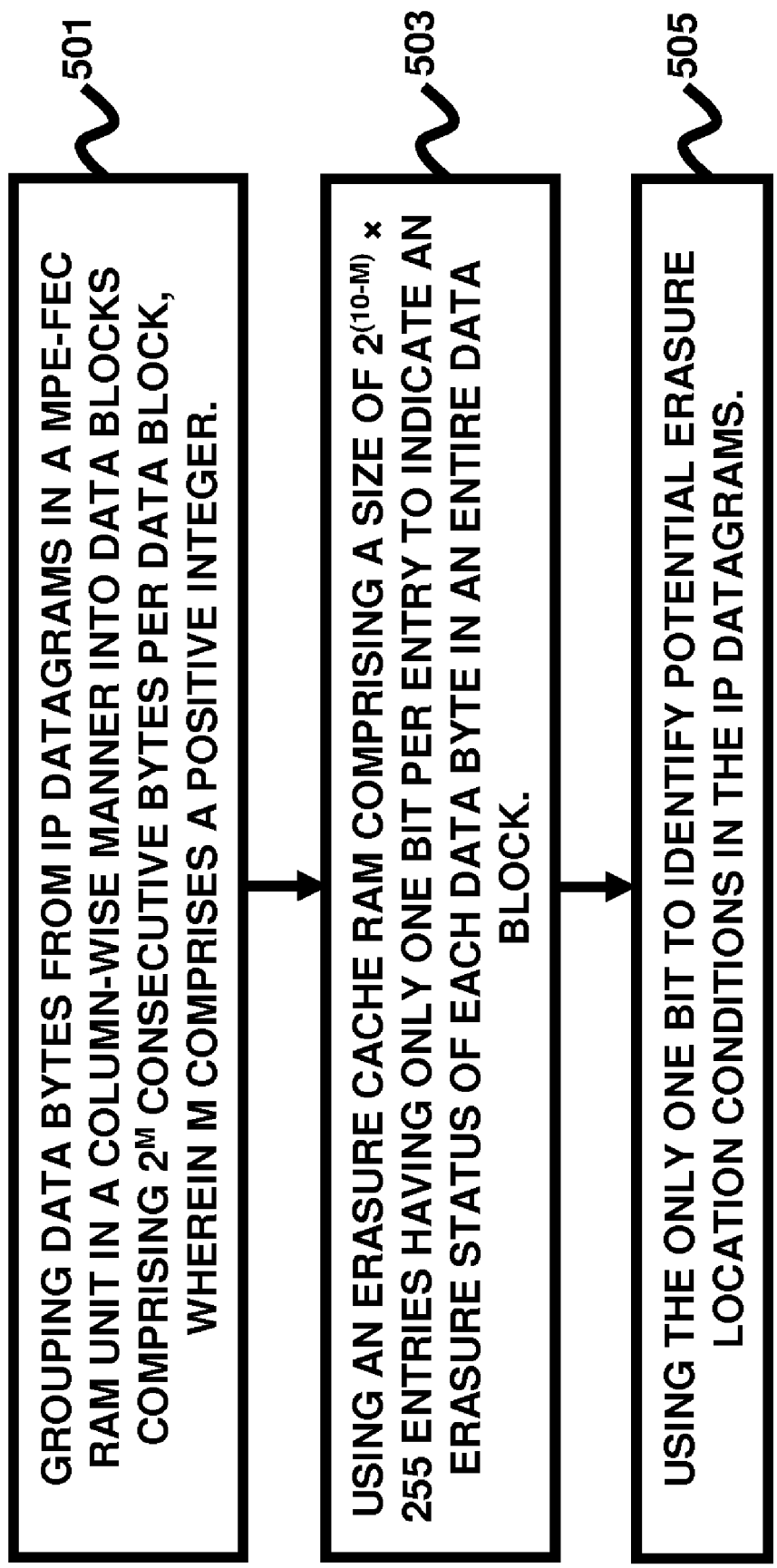

FIG. 6(C) is a flow diagram illustrating the Single-bit Block Mapping technique of FIG. 3, wherein FIG. 6(C) illustrates a method of identifying erasure locations in transmitted data received by a DVB-H receiver 100 (of FIG. 4), wherein the method comprises grouping (501) data bytes from IP datagrams in a MPE-FEC RAM unit 201c in a column-wise manner into data blocks comprising $2^M$ consecutive bytes per data block, wherein M comprises a positive integer; using (503) an erasure cache RAM 203c comprising a size of $2^{(10-M)} \times 255$ entries having only one bit per entry to indicate an erasure status of each data byte in an entire data block; and using (505) the only one bit to identify potential erasure location conditions in the IP datagrams.

Preferably, when a particular data block covers more than one IP datagram and there are CRC mismatches in any of the IP datagrams, then the particular data block is marked as an erasure. Moreover, when the particular data block is not marked as an erasure, then the particular data block is preferably marked as error free. Furthermore, when M equals 4, a size of the erasure cache RAM 203c per MPE frame preferably equals 16K. Additionally, when M equals 5, a size of the erasure cache RAM 203c per MPE frame preferably equals 8K. Also, when M equals 6, a size of the erasure cache RAM 203c per MPE frame preferably equals 4K. The method may further comprise using the only one bit to identify two possible erasure statuses of a corresponding data block.

Figure 6D:
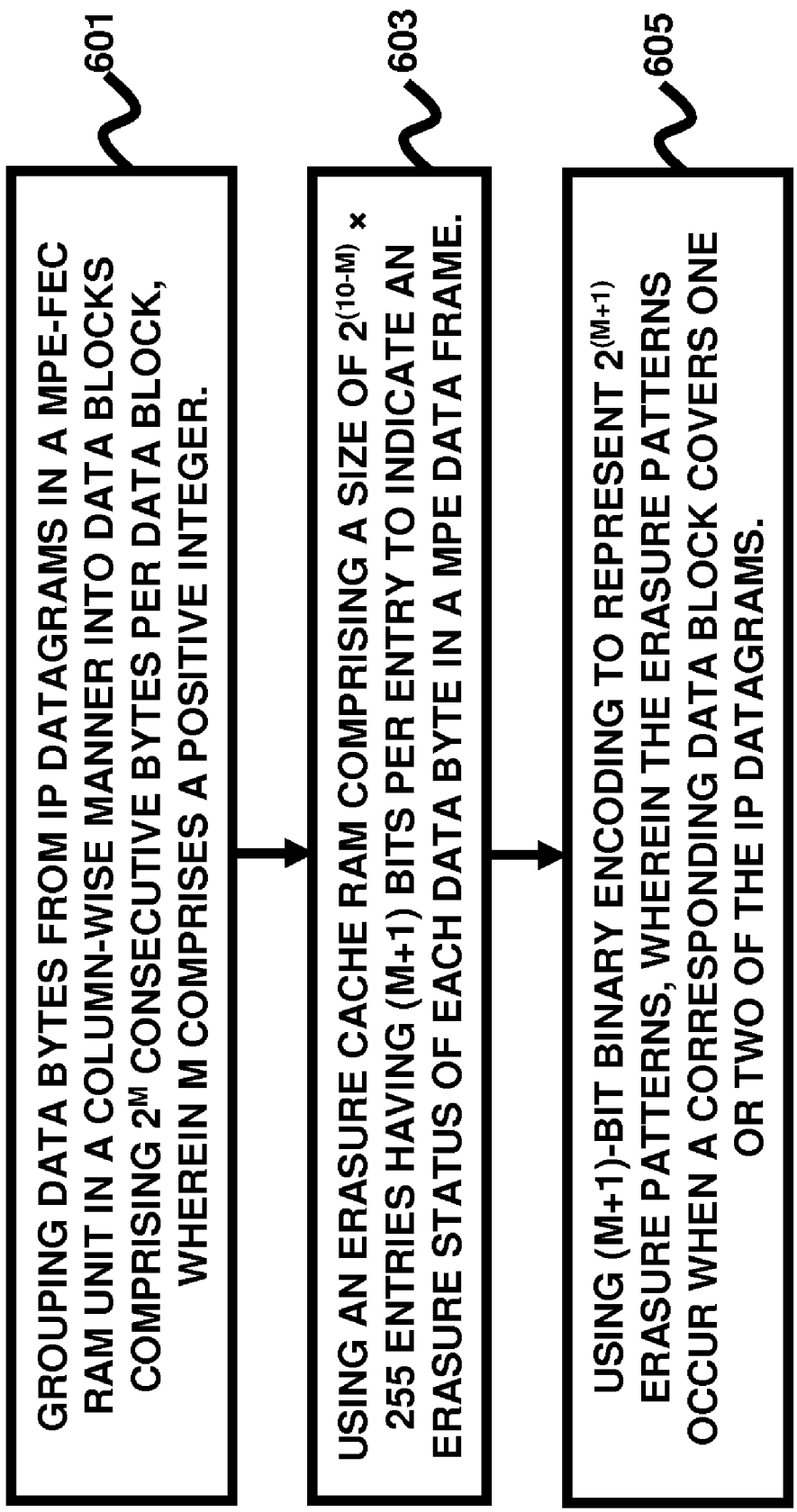

FIG. 6(D) is a flow diagram illustrating a general lossless method of identifying erasure locations in transmitted data received by a DVB-H receiver 100 (of FIG. 4), wherein the method comprises grouping (601) data bytes from IP datagrams in a MPE-FEC RAM unit 104 in a column-wise manner into data blocks comprising $2^M$ consecutive bytes per data block, wherein M comprises a positive integer; using (603) an erasure cache RAM 107 comprising a size of $2^{(10-M)} \times 255$ entries having (M+1) bits per entry to indicate an erasure status of each data byte in a MPE data frame; and using (605) (M+1)-bit binary encoding to represent $2^{(M+1)}$ erasure patterns, wherein the erasure patterns occur when a corresponding data block covers one or two of the IP datagrams.

The embodiments herein include both hardware and software elements. The embodiments implemented in software include, but is not limited to, firmware, resident software, microcode, etc. Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, RAM, a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

The techniques provided by the embodiments herein may be implemented on an integrated circuit (IC) chip or using printable electronic technologies (not shown). The chip or printable electronic circuit design is created in a graphical computer programming language, and stored in a computer storage medium (such as a disk, tape, physical hard drive, or virtual hard drive such as in a storage access network). If the designer does not fabricate chips or printable electronic circuits or the photolithographic masks used to fabricate chips or printable electronic circuits, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII or CIF) for the fabrication of photolithographic masks, which typically include multiple copies of the chip design in question that are to be formed on a wafer or printed on a suitable substrate. The photolithographic masks are utilized to define areas of the wafer or printable electronic circuits (and/or the layers thereon) to be etched or otherwise processed or printed.

The resulting integrated circuit chips or printable electronic circuits can be distributed by the fabricator in raw wafer form (that is, as a single wafer that has multiple unpackaged chips), as a bare die, or in a packaged form or as individual printed circuits or in a sheet or roll of printed circuits. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip might then be integrated with other chips, discrete circuit elements, and/or other signal processing devices as part of either (a) an intermediate product, such as a mother or daughter-board, or (b) an end product. The end product can be any product that includes integrated circuit chip or chips and/or printed circuits, ranging from toys and other low-end applications to advanced computer products having a display, a keyboard or other input device, and a central processor.

A representative hardware environment for practicing the embodiments herein is depicted in FIG. 7. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a RAM 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A method of identifying erasure locations in transmitted data received by a Digital Video Broadcasting over Handheld (DVB-H) receiver, said method comprising:
grouping data bytes from Internet Protocol (IP) datagrams in a Multi-Protocol Encapsulator Forward Error Correction Random Access Memory (MPE-FEC RAM) unit in a column-wise manner into data blocks comprising $2^M$ consecutive bytes per data block, wherein M comprises a positive integer;
using an erasure cache RAM comprising a size of $2^{(10-M)} \times 255$ entries having (M+2) bits per entry to indicate an erasure status of each data byte in a MPE data frame;
using M bits in the (M+2)-bit entry in said erasure cache RAM to identify a $2^M-1$ potential boundary of said IP datagrams when a corresponding data block covers two said IP datagrams; and
using a remaining two bits in said (M+2)-bit entry to identify potential erasure location conditions in said IP datagrams.

2. The method of claim 1, wherein said MPE-FEC RAM comprises $2^{(10-M)} \times 255$ data blocks per said MPE data frame.

3. The method of claim 1, wherein $2^M$ is no larger than a smallest IP datagram length such that each said data block of $2^M$ bytes comprises data from at most two said IP datagrams.

4. The method of claim 1, wherein a size of said erasure cache RAM comprises at most 32 Kbits.

5. The method of claim 1, wherein said potential erasure location conditions comprises:
a first condition where both of said two said IP datagrams are error free;
a second condition where only a first one of said two said IP datagrams has errors;
a third condition where only a second one of said two said IP datagrams has errors; and a fourth condition where said both of said two IP datagrams have errors.

6. The method of claim 5, wherein in said first condition, no erasures exist in the $2^M$ byte data block.

7. The method of claim 5, wherein in said second condition, all said data bytes before a corresponding IP datagram boundary are marked as erasures.

8. The method of claim 5, wherein in said third condition, all said data bytes after a corresponding IP datagram boundary are marked as erasures.

9. The method of claim 5, wherein in said fourth condition, all said data bytes in a corresponding data block is marked as an erasure.

10. The method of claim 1, wherein said M bits in said (M+2)-bit entry is used to indicate whether a corresponding data block covers data from exactly one IP datagram.

11. The method of claim 5, wherein said two bits in said (M+2)-bit entry is used to indicate the first, second, third, and fourth conditions.

12. A method of identifying erasure locations in transmitted data received by a Digital Video Broadcasting over Handheld (DVB-H) receiver, said method comprising:
grouping data bytes from Internet Protocol (IP) datagrams in a Multi-Protocol Encapsulator Forward Error Correction Random Access Memory (MPE-FEC RAM) unit in a column-wise manner into data blocks comprising $2^M$ consecutive bytes per data block, wherein M comprises a positive integer;
using an erasure cache RAM comprising a size of $2^{(10-M)} \times 255$ entries having (M+1) bits per entry to indicate an erasure status of each data byte in a MPE data frame;
using M bits in the (M+1)-bit entry in said erasure cache RAM to identify a $2^M-1$ potential boundary of said IP datagrams when a corresponding data block covers two said IP datagrams with a different cycle redundancy check (CRC) matching status; and
using a remaining one bit in said (M+1)-bit entry to identify potential erasure location conditions in said IP datagrams.

13. The method of claim 12, wherein said MPE-FEC RAM comprises $2^{(10-M)} \times 255$ data blocks per said MPE data frame.

14. The method of claim 12, wherein $2^M$ is no larger than a smallest IP datagram length such that each said data block of $2^M$ bytes comprises data from at most two said IP datagrams.

15. The method of claim 12, wherein a size of said erasure cache RAM comprises at most 28 Kbits.

16. The method of claim 12, wherein said potential erasure location conditions comprises:
a first condition where only a first one of said two said IP datagrams has errors; and
a second condition where only a second one of said two said IP datagrams has errors.

17. The method of claim 16, wherein in said first condition, all said data bytes before a corresponding IP datagram boundary are marked as erasures.

18. The method of claim 16, wherein in said second condition, all said data bytes after a corresponding IP datagram boundary are marked as erasures.

19. The method of claim 12, wherein said M bits in said (M+1)-bit entry is used to indicate whether a corresponding data block covers data from exactly one IP datagram or covers two datagrams of the same CRC matching status.

20. The method of claim 16, wherein said remaining one bit in said (M+1)-bit entry is used to indicate the first and second conditions for a corresponding data block.

21. A method of identifying erasure locations in transmitted data received by a Digital Video Broadcasting over Handheld (DVB-H) receiver, said method comprising:
grouping data bytes from Internet Protocol (IP) datagrams in a Multi-Protocol Encapsulator Forward Error Correction Random Access Memory (MPE-FEC RAM) unit in a column-wise manner into data blocks comprising $2^M$ consecutive bytes per data block, wherein M comprises a positive integer;
using an erasure cache RAM comprising a size of $2^{(10-M)} \times 255$ entries having only one bit per entry to indicate an erasure status of each data byte in an entire data block; and
using said only one bit to identify potential erasure location conditions in said IP datagrams.

22. The method of claim 21, wherein when a particular data block covers more than one IP datagram and there are cycle redundancy check (CRC) mismatches in any of the IP datagrams, then said particular data block is marked as an erasure.

23. The method of claim 22, wherein when said particular data block is not marked as an erasure, then said particular data block is marked as error free.

24. The method of claim 21, wherein when said M equals 4, a size of said erasure cache RAM per MPE frame equals 16K.

25. The method of claim 21, wherein when said M equals 5, a size of said erasure cache RAM per MPE frame equals 8K.

26. The method of claim 21, wherein when said M equals 6, a size of said erasure cache RAM per MPE frame equals 4K.

27. The method of claim 23, further comprising using said only one bit to identify two possible erasure statuses of a corresponding data block.

28. A lossless method of identifying erasure locations in transmitted data received by a Digital Video Broadcasting over Handheld (DVB-H) receiver, said method comprising:
grouping data bytes from Internet Protocol (IP) datagrams in a Multi-Protocol Encapsulator Forward Error Correction Random Access Memory (MPE-FEC RAM) unit in a column-wise manner into data blocks comprising $2^M$ consecutive bytes per data block, wherein M comprises a positive integer;
using an erasure cache RAM comprising a size of $2^{(10-M)} \times 255$ entries having (M+1) bits per entry to indicate an erasure status of each data byte in a MPE data frame; and
using (M+1)-bit binary encoding to represent $2^{(M+1)}$ erasure patterns, wherein the erasure patterns occur when a corresponding data block covers one or two of said IP datagrams.

* * * * *